United States Patent [19]

Arai et al.

[11] Patent Number: 5,192,993

[45] Date of Patent: Mar. 9, 1993

[54] SEMICONDUCTOR DEVICE HAVING IMPROVED ELEMENT ISOLATION AREA

[75] Inventors: Takashi Arai; Nakafumi Inada, both of Yokohama; Tsutomu Takahashi, Kawasaki, all of Japan

[73] Assignee: Kabushiki Kaisha Toshiba, Kawasaki, Japan

[21] Appl. No.: 601,342

[22] Filed: Oct. 23, 1990

Related U.S. Application Data

[63] Continuation of Ser. No. 380,310, Jul. 17, 1989, abandoned.

[30] Foreign Application Priority Data

Sep. 27, 1988 [JP] Japan .................... 63-241501

[51] Int. Cl.$^5$ .................................. H01L 29/34
[52] U.S. Cl. ................................ 257/400; 257/652
[58] Field of Search .............. 357/23.11, 52, 59 G

[56] References Cited

U.S. PATENT DOCUMENTS

| | | | |
|---|---|---|---|
| 3,728,161 | 4/1973 | Moline | 357/52 |
| 3,806,371 | 4/1974 | Barone | 357/23.11 |
| 3,867,204 | 2/1975 | Rutledge | 357/23.11 |
| 3,925,120 | 12/1975 | Saida et al. | 357/23.11 |
| 3,936,858 | 2/1976 | Seeds et al. | 357/23.11 |
| 4,014,037 | 3/1977 | Matsushita et al. | 357/52 |
| 4,217,149 | 8/1980 | Sawazaki | 357/23.11 |
| 4,219,379 | 8/1980 | Athanas | 357/23.11 |
| 4,261,095 | 4/1981 | Dreves et al. | 357/52 |
| 4,383,266 | 5/1983 | Sakai et al. | 357/52 |
| 4,412,242 | 10/1983 | Herman et al. | 357/52 |
| 4,414,560 | 11/1983 | Lidow | 357/52 |
| 4,468,852 | 9/1984 | Cerofolini | 357/52 |
| 4,742,377 | 5/1988 | Einthoven | 357/52 |

FOREIGN PATENT DOCUMENTS

| | | |
|---|---|---|
| 0127142 | 5/1984 | European Pat. Off. |
| 2056969 | 7/1971 | France |
| 1312299 | 4/1973 | Japan .................... 357/23.11 |
| 58-016568 | 1/1983 | Japan .................... 357/23.11 |
| 58-040865 | 3/1983 | Japan .................... 357/52 |
| 59-184561 | 10/1984 | Japan .................... 357/23.11 |
| 62-250671 | 10/1987 | Japan .................... 357/23.11 |
| 1131675 | 10/1968 | United Kingdom . |

OTHER PUBLICATIONS

Muller & Kamins, *Device Electronics for Integrated Circuits*, 1986, pp. 443-449.
European Search Report and Annex for Application EP 89 11 3245.

*Primary Examiner*—Andrew J. James
*Assistant Examiner*—Sara W. Crane
*Attorney, Agent, or Firm*—Finnegan, Henderson, Farabow, Garrett, and Dunner

[57] ABSTRACT

A semiconductor device of the present invention is disclosed which includes a semiconductor device of a predetermined conductivity type having a predetermined impurity concentration, a source/drain area formed on the upper surface portion of the semiconductor substrate and a guard ring formed around the source/drain area and having the same conductivity as that of the semiconductor substrate. A gate oxide film is formed on the source/drain area and guard ring and an interconnection layer, such as polysilicon, is formed on the gate oxide film. The guard ring has its impurity concentration set to be higher than that of the semiconductor substrate. The guard ring per se has a portion intersecting with the interconnection layer through a thicker portion of a gate oxide film disposed over the intersecting portion of the guard ring, and a remaining portion, the intersecting portion of the guard ring being higher in impurity concentration than the remaining portion of the guard ring. The gate oxide film is so formed as to be thicker over the intersecting portion of the guard than over the source/drain area in terms of their thickness.

6 Claims, 3 Drawing Sheets

SEMICONDUCTOR DEVICE HAVING IMPROVED ELEMENT ISOLATION AREA

This application is a continuation of application Ser. No. 380,310, filed Jul. 17, 1989, now abandoned.

BACKGROUND OF THE INVENTION

1. Field of the Invention

The present invention relates to a semiconductor device and, more particularly, to a semiconductor device including high voltage withstand transistors with an improved element isolation area for use as a high voltage withstand section of a large LC (liquid crystal) driver type LSI.

2. Description of the Related Art

A guard ring system has so far been employed as a technique for forming an element isolation area in a high voltage withstand transistor.

In a high voltage withstand transistor, for example, a polysilicon connection layer which is the electrode of that transistor is formed in contact with drain and source regions formed in the upper surface portion of a semiconductor substrate. A field oxide film is formed around the drain and source regions and a guard ring is formed around the field oxide film and has a predetermined impurity concentration.

In the arrangement of the high voltage withstand transistor, the polysilicon connection layer providing the electrodes of the transistor is situated over the guard ring in an intersecting way. For the guard ring of a p-type (n-type), for example, the guard ring portion which is situated just over that polysilicon connection layer is inverted to an n-type (p-type) at about 10 V.

Therefore, a device whose withstand voltage exceeding 30 V is usually of such a type as shown in FIG. 1A and 1B. FIG. 1A is a plan view showing an array pattern of a high voltage withstand transistor of the prior art and FIG. 1B is a cross-sectional view showing the transistor of FIG. 1A.

In FIGS. 1A and 1B, a drain/source area 14 is formed in the upper surface portion of a semiconductor substrate 12 and a field oxide film 16a of about 10000Å in thickness is formed around the drain/source area 14 at a predetermined interval. A guide ring 18 is formed around the field oxide film 16a such that it is situated near the field oxide film 16b. On that portion of the upper surface of the substrate 12, including the surface portion of the drain/source area 14, which is surrounded with the field oxide film 16a, a gate oxide film 20 is formed as an insulating film. A polysilicon connection layer 22 is formed on the gate oxide film 20 and field oxide film 16a. A field oxide film 24 is formed on the polysilicon connection layer 22, field oxide film 16b and guard ring 18. Aluminum interconnection layers 28a and 28b are connected respectively via contact areas 26a and 26b to the polysilicon connection layer 22 just over the field oxide film 16a. In order to make an inversion threshold voltage of the guard ring 18 high, the aluminum interconnection layers 28a and 28b are patterned after the field oxide films 16a, 16b and 24 have been formed.

In the conventional high voltage withstand transistor thus arranged, it is possible to raise the withstand voltage if the guard ring 18 is employed as element isolation for the high voltage withstand transistor.

However, the aluminum interconnection layers 28a and 28b are used at an intersecting location of the guard ring 18, requiring contact areas 26a and 26b between the polysilicon connection layer 22 and the aluminum interconnection layers 28a and 28b. Thus the field oxide layer is necessary for the formation of the contact areas 26a and 26b, unavoidably leading to an increase in the chip size of the transistor and hence to a cost problem.

SUMMARY OF THE INVENTION

It is accordingly the object of the present invention to provide a semiconductor device which can reduce a chip size without lowering a withstand voltage.

According to the present invention there is provided a semiconductor device comprising:

- a semiconductor substrate of a predetermined conductivity type having a predetermined impurity concentration;
- electrodes formed in an upper surface portion of the semiconductor substrate;
- guard ring formed around the electrodes and having the same conductivity type as that of the semiconductor substrate, the guard ring having a first portion having a higher impurity concentration than that of the semiconductor substrate and at least one second portion having a higher impurity concentration than that of the first portion;
- a gate insulating film formed on the electrodes and guard ring and having a predetermined thickness, the gate insulating film is thicker over the second portion of the guard ring than over the electrodes; and
- an interconnection layer formed over the gate insulating film and intersecting with the second portion of the guard ring.

BRIEF DESCRIPTION OF THE DRAWINGS

These and other features and advantages of the present invention will become more apparent from the following detailed description of an exemplary embodiment as illustrated in the accompanying drawings in which:

FIG. 1B being a cross sectional view as taken along line 1B—1B in FIG. 1A;

FIG. 2A being a plan view showing a pattern of a high voltage withstand transistor and FIG. 2B being a cross-sectional view as taken along line 2B—2B in FIG. 2A.

DETAILED DESCRIPTION OF THE PREFERRED EMBODIMENT

The embodiment of the present invention will be explained below with reference to the accompanying drawings.

Figure 1A:
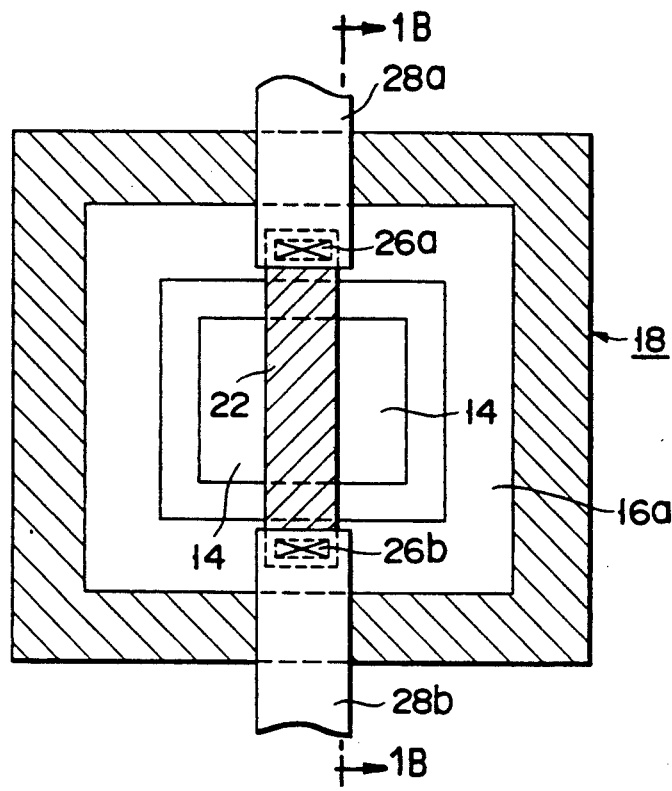
FIGS. 1A and 1B are a plan view and cross-sectional view, respectively, showing a high voltage withstand transistor according to a conventional semiconductor device.
Figure 1B:
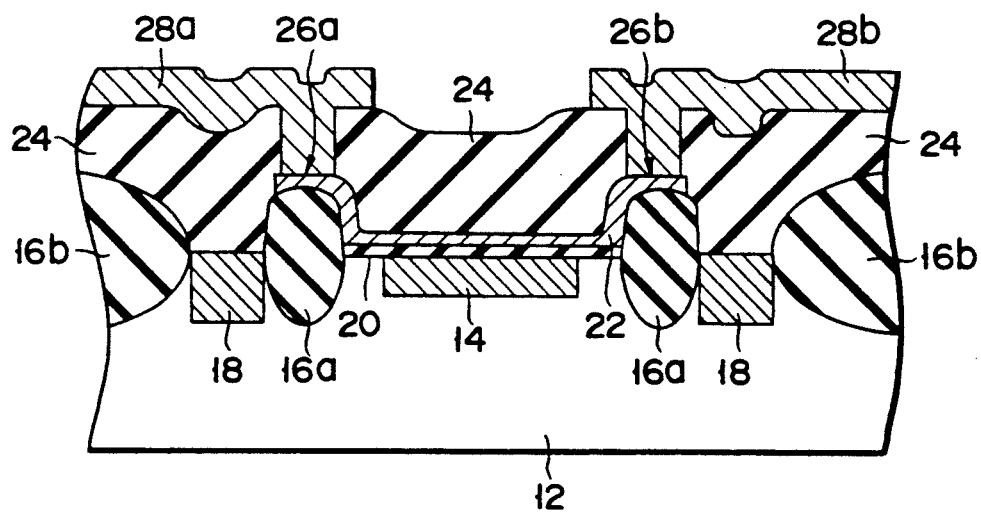
Figure 2A:
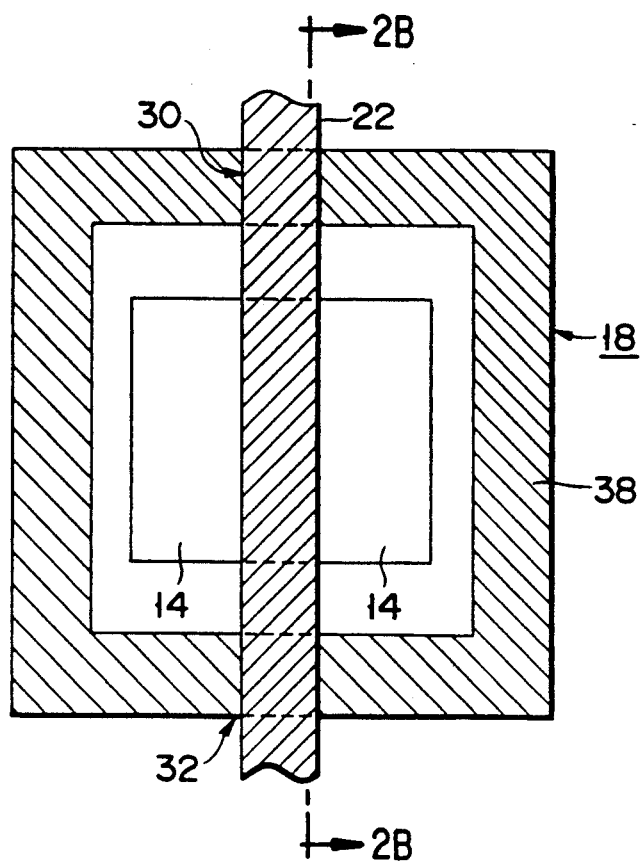
FIGS. 2A and 2B show a semiconductor device according to one embodiment of the present invention.
Figure 2B:
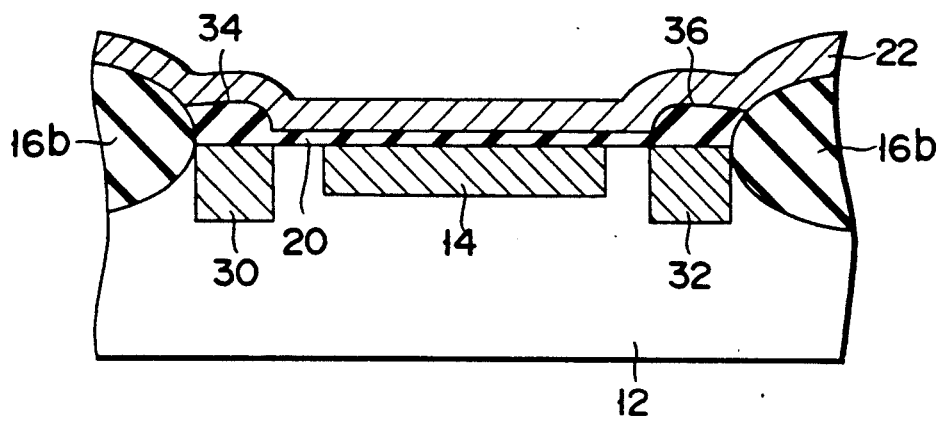

FIGS. 2A and 2B show an arrangement of a high voltage withstand transistor according to one embodiment of the present invention, FIG. 2A being a plan view showing a pattern of the transistor and FIG. 2B being a cross-sectional view, as taken along line 2B—2B in FIG. 2A. Like reference numerals are employed in this embodiment by attaching like reference numerals to elements corresponding to those in FIG. 1.

A drain/source area 14 is formed in the upper surface portion of a semiconductor substrate 12 and a guard ring 18 is formed outside the drain/source area 14 with a predetermined spacing left therebetween. A field oxide film 16b is formed outside the guard ring 18.

On the upper surface portion of the semiconductor substrate 12 including the intersecting portions of guard ring portions 30, 32 as will be set forth in more detail below, and on the drain/source areas 14, a gate oxide film 20 is formed as an insulating film. The gate oxide film 20 is, for example, 700Å thick at a location between the guard ring portions 30, 32 and 2000Å A thick at the gate oxide film intersecting portions 34, 36 adjacent to the intersecting portions of the guard ring portions 30, 32. On the gate oxide film 20 and field oxide film 16b, a polysilicon connection layer 22 is formed as an electrode.

The guard ring 18 surrounds the outside of the drain/source area 14 relative to the substrate 12 and has its impurity concentration locally varied and hence is not fixed in its impurity concentration. The guard ring portions 30, 32 are disposed to intersect polysilicon layer 22 through the thicker gate oxide film portions 34, 36, which are interposed therebetween. Guard ring portions 30, 32 are set to be higher in impurity concentration than the rest (the remaining portion) 38 of the guard ring 18. In order to raise the concentration of the aforementioned guard ring portions 30, 32, more impurity is implanted there than the remaining portion 38 of the guard ring 18.

Here in order not to increase a diffusion depth $x_j$ due to an increase in the coefficient of impurity diffusion into the silicon, the aforementioned concentration level is predetermined. In the aforementioned embodiment, the guard ring portions 30, 32 as set forth above have their impurity concentration raised by $BF_2$ for a P type and As for an N type. For example, the impurity concentration of the guard ring portions 30, 32 as set forth above is $1 \times 10^{20}$ cm$^{-3}$ and that of said remaining portion of the guard ring 18 is $1 \times 10^{17}$ cm$^{-3}$.

In order to prevent a possible crystal defect in an ion implantation step and a possible out-diffusion in a subsequent oxidation step, an ion implantation is carried out through an ion passage through a silicon oxide film ($SiO_2$). On the other hand, as the guard ring portions 30, 32 as set forth above are thicker, that is 700Å, an impurity ion cannot be implanted into silicon through a passage through an oxide film. Thus, the aforementioned ion implantation step is conducted via the 100Å thick oxide film by a step called a dummy oxidation film step. By so doing, the guard ring portions 30, 32 of the guard ring 18 become very useful in terms of an increased inversion threshold voltage and an enhanced reliability.

The gate oxide film intersecting portions 34, 36 of the gate oxide film 20 are made thick compared with the rest of the gate oxide film 20. That is, the guard ring portions 30, 32 intersecting with the polysilicon connection layer 22 have their thickness increased by their own particular photoetching step, for example, from ordinary 700Å to 2000Å. By so doing, the inversion threshold voltage of the guard ring portions 30, 32 is increased without varying the characteristic of the high voltage withstand transistor.

Of the guard ring 18, only the guard ring portions 30, 32 have their impurity increased and the remaining portion 38 of the guard ring 18 is low in impurity relative to the guard ring portions 30, 32. It is, therefore, possible to, at a heat-treating step following the step of forming the impurity-increased guard ring portions, prevent unwanted impurity diffusion to a minimum possible extent and hence prevent an adverse effect which might otherwise occur by that diffusion step.

Figure 3:
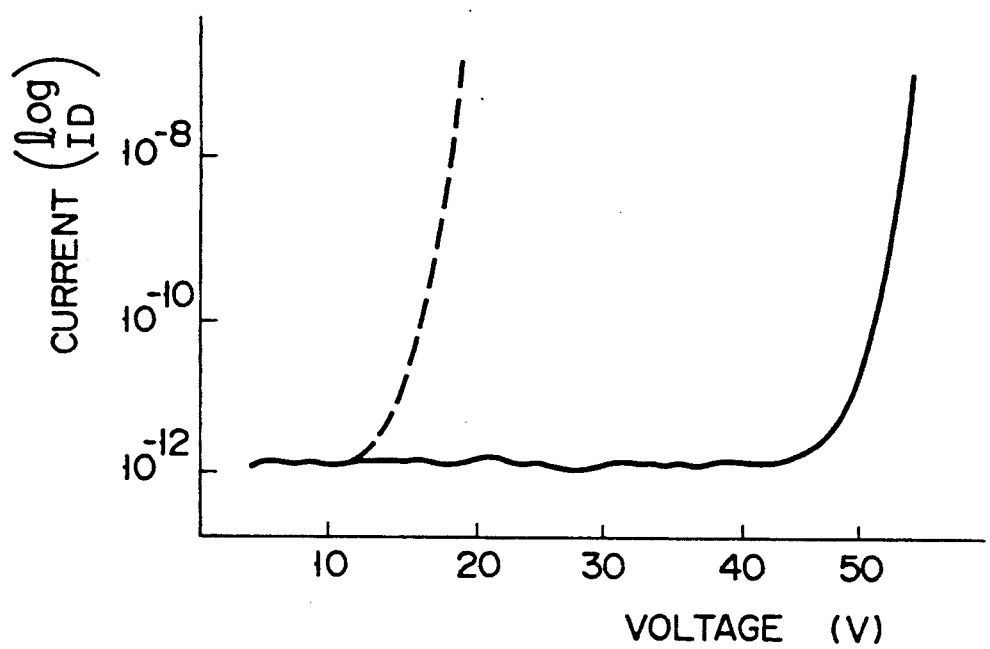
FIG. 3 shows a withstand voltage characteristic curve of the high withstand voltage transistor of the present invention.

FIG. 3 is a characteristic curve representing the voltage withstand characteristic of the high voltage withstand transistor according to the embodiment of the present invention. In the graph of FIG. 3, the ordinate shows a dissipation current at the turn-OFF time of the transistor as set forth above and the abscissa shows a voltage which is applied to that transistor.

In the graph of FIG. 3, the characteristic curve as indicated by the dotted line shows a case of a basic high voltage withstand transistor with a gate oxide film of a uniform thickness and with the impurity concentration of the guard ring kept constant. From this graph it will be seen that the withstand voltage of the transistor is about 15 V. The high voltage withstand transistor according to the embodiment of the present invention has a characteristic curve as indicated by the solid line in FIG. 3. From this graph it will be appreciated that the withstand voltage of the present transistor is about 45 to 50 V as a limit. In this case, it is possible to improve the voltage withstand characteristic of the present invention by a factor of three.

Since the embodiment of the present invention obviates the necessity for providing a contact between the polysilicon connection layer and the aluminum interconnection layer as in the prior art, it is possible to reduce a requisite occupation area. Furthermore the present invention can eliminate the need for providing the field oxide film inside the guard ring, thus achieving a high packing density with a smaller requisite area.

What is claimed is:

1. An electronic device having a high inversion threshold voltage, comprising:
    a substrate of a first conductivity type and a first impurity concentration, having an upper surface portion;
    a semiconductor portion of a second conductivity type disposed on the upper surface portion of said substrate, having an exposed surface;
    guard ring means disposed on the upper surface portion of said substrate, having an exposed surface, defining an annulus around said semiconductor portion for isolating said semiconductor portion, including a first guard ring portion of said first conductivity type having a second impurity concentration greater than said first impurity concentration, and diametrically opposed second guard ring portions of said first conductivity type having a third impurity concentration greater than said second impurity concentration for providing the high inversion threshold voltage;
    a generally rectangular gate insulating film including a central portion having a first thickness overlaying and in contact with a portion of said exposed surface of said semiconductor portion, and end portions covering and in contact with said exposed surfaces of said diametrically opposed second guard ring portions of said guard ring means, having a second thickness greater than said first thickness; and
    an interconnection layer overlaying said gate insulating film, intersecting said second guard ring portions of said guard ring means through said end portions of said gate insulating film.

2. An electronic device according to claim 1, wherein said semiconductor portion comprises a source region.

3. An electronic device according to claim 1, wherein said first thickness of said central portion of said gate insulating film is about 700Å and said second thickness of said end portions of said gate insulating film is about 2000Å.

4. An electronic device according to claim 1, wherein said semiconductor portion comprises a drain region.

5. An electronic device according to claim 1 wherein said interconnection layer is formed of polysilicon.

6. An electronic device according to claim 1, wherein said gate insulating film is formed of a gate oxide film.

* * * * *